(12) United States Patent
Wang (10) Patent No.: US 10,013,018 B2
(45) Date of Patent: Jul. 3, 2018

(54) SINE WAVE GENERATING APPARATUS AND METHOD

(71) Applicant: Shenzhen Goodix Technology Co., Ltd., Shenzhen (CN)

(72) Inventor: Guangyao Wang, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 229 days.

(21) Appl. No.: 15/230,484

(22) Filed: Aug. 8, 2016

(65) Prior Publication Data

US 2016/0342174 A1  Nov. 24, 2016

Related U.S. Application Data

(63) Continuation of application No. PCT/CN2014/084421, filed on Aug. 14, 2014.

(30) Foreign Application Priority Data

Feb. 13, 2014  (CN) .......................... 2014 1 0050499

(51) Int. Cl.
*G06F 1/00* (2006.01)
*G06F 1/03* (2006.01)
*H03K 3/012* (2006.01)
*G06F 1/02* (2006.01)

(52) U.S. Cl.
CPC .......... *G06F 1/0321* (2013.01); *G06F 1/0328* (2013.01); *H03K 3/012* (2013.01); *G06F 1/022* (2013.01); *G06F 1/03* (2013.01)

(58) Field of Classification Search
None
See application file for complete search history.

(56) References Cited

U.S. PATENT DOCUMENTS 5,014,231 A  5/1991 Reinhardt et al.
5,563,535 A * 10/1996 Corry .................... G06F 1/0328
                                                                   327/105

(Continued)

FOREIGN PATENT DOCUMENTS

CN  103795345 A  5/2014

*Primary Examiner* — Tuan T Lam (57) ABSTRACT

A sine wave generating apparatus comprises: a phase accumulating module, configured to acquire configuration information of a sine wave, and generate address information comprising integer address information and decimal address information; a value searching module, configured to search for first data information and second data information of the sine wave according to the integer address information; an interpolation module, configured to conduct interpolation between the first data information and the second data information, and acquire interpolation original data information of the sine wave according to the decimal address information; a random truncating module, configured to conduct truncation processing on the interpolation original data according to the bit width of the decimal address information and a pseudorandom sequence output value to acquire final interpolation data information of the sine wave; and a sine wave generating module, configured to generate image information of the sine wave according to the final interpolation data information of the sine wave.

16 Claims, 7 Drawing Sheets

(56) References Cited

U.S. PATENT DOCUMENTS

| | | | | |
|---|---|---|---|---|
| 5,799,265 A | * | 8/1998 | He | G06F 1/0321 |
| | | | | 702/66 |
| 5,864,492 A | * | 1/1999 | Sadot | G06F 1/0328 |
| | | | | 708/253 |
| 5,951,625 A | | 9/1999 | Duvanenko et al. | |
| 6,356,124 B1 | * | 3/2002 | Schoch | G06F 1/0321 |
| | | | | 327/106 |
| 2005/0146360 A1 | * | 7/2005 | Reichert | G06F 1/0328 |
| | | | | 327/105 |
| 2007/0040615 A1 | * | 2/2007 | Ammar | G06F 1/0328 |
| | | | | 331/2 |
| 2008/0285698 A1 | * | 11/2008 | Mallinson | G06F 1/025 |
| | | | | 375/376 |
| 2010/0182053 A1 | * | 7/2010 | Tsai | G06F 1/0353 |
| | | | | 327/106 |
| 2015/0006599 A1 | * | 1/2015 | Cho | G06F 17/10 |
| | | | | 708/235 |
| 2015/0168990 A1 | * | 6/2015 | Park | H01L 41/042 |
| | | | | 318/116 |
| 2015/0171792 A1 | * | 6/2015 | Kim | H02N 2/008 |
| | | | | 310/317 |
| 2016/0079987 A1 | * | 3/2016 | Gurumani | H03L 7/00 |
| | | | | 331/34 |

* cited by examiner

SINE WAVE GENERATING APPARATUS AND METHOD

CROSS-REFERENCE TO RELATED APPLICATIONS

This application is a continuation of International Patent Application No. PCT/CN2014/084421, file on Aug. 14, 2014, which claims priority to Chinese Patent Application No. 201410050499.7, filed on Feb. 13, 2014, both of which are hereby incorporated by reference in its entireties.

TECHNICAL FIELD

The present invention relates to the technical field of digital circuits, and in particular, relates to a sine wave generating apparatus and method.

BACKGROUND

At present, a plurality of methods are available for generating a sine wave by using a digital circuit. For example, the sine wave is generated by using Matrix Laboratory (MATLAB) or other software tools. However, the current problem is that data information of the sine wave is all stored in a value search table, and when generating the sine wave, the MATLAB or the other software tools directly output the data in the value search table according to the actual needs, but are not capable of generating data information of the sine wave except the value search table. Therefore, the conventional methods are somewhat limitative. Some methods may only be used for generating sine waves with specific frequencies, or some methods require a great circuit area during generation of sine waves with different frequencies. In addition, inaccurate frequency or drift of the sine wave may be present. Therefore, high power consumption and high cost are caused in the generation of the sine wave by using the digital circuit, and the time-domain and frequency-domain effects of the generated sine wave are poor.

SUMMARY

The present invention is intended to solve at least one of the above problems in the related art.

One embodiment of the present invention provides a sine wave generating apparatus, comprising: a phase accumulating module, configured to acquire configuration information of a sine wave, and generate address information of the sine wave according to the configuration information of the sine wave, wherein the address information of the sine wave comprises integer address information and decimal address information; a value searching module, configured to search for first data information and second data information of the sine wave according to the integer address information; an interpolation module, configured to conduct interpolation between the first data information and the second data information according to the bit width of the decimal address information, and acquire interpolation original data information of the sine wave according to the decimal address information; a random truncating module, configured to conduct truncation processing on the interpolation original data according to the bit width of the decimal address information and a pseudorandom sequence output value to acquire final interpolation data information of the sine wave; and a sine wave generating module, configured to generate image information of the sine wave according to the final interpolation data information of the sine wave.

Figure 4:
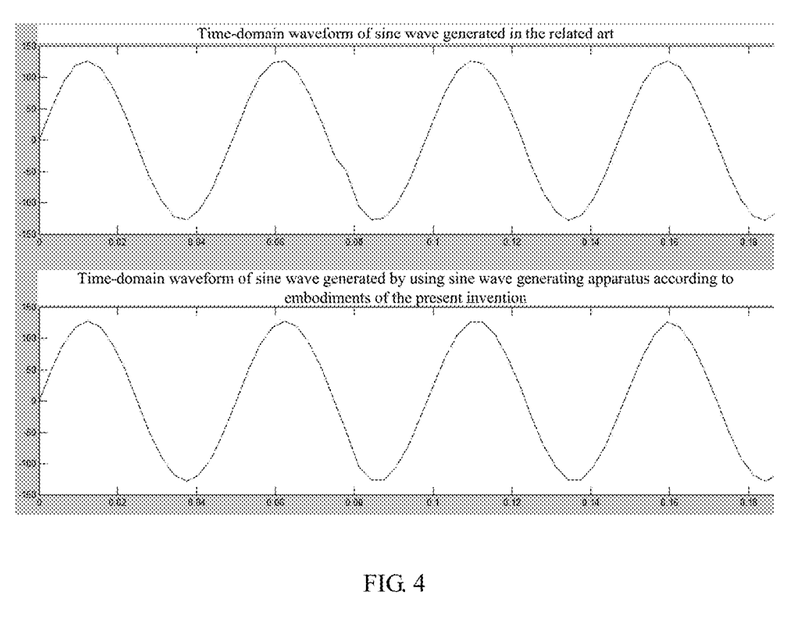
FIG. 4 is a schematic diagram of a simulated comparison of time-domain waveforms of sine waves generated by the sine wave generating apparatus in the related art and the sine wave generating apparatus according to an embodiment of the present invention.
Figure 5:
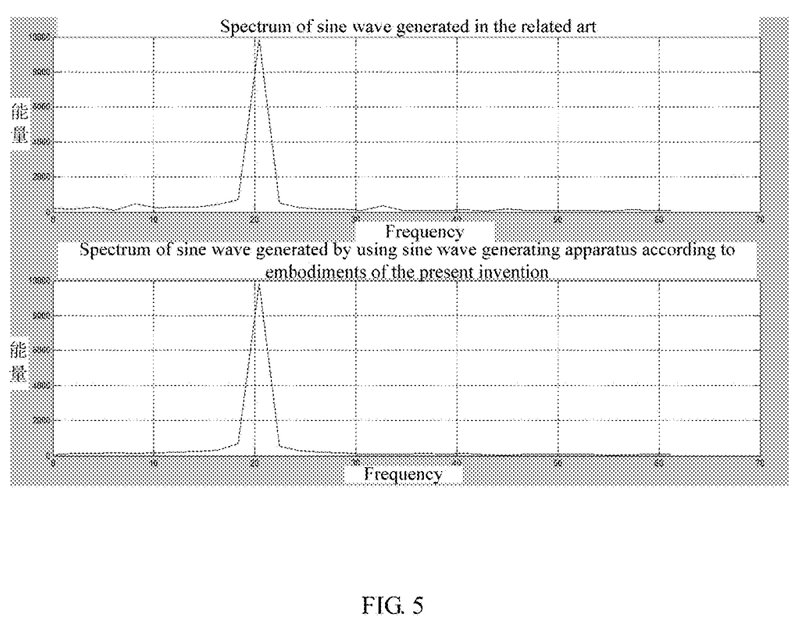
FIG. 5 is a schematic diagram of a simulated comparison of spectrums of sine waves generated by the sine wave generating apparatus in the related art and the sine wave generating apparatus according to an embodiment of the present invention.

With respect to the sine wave generating apparatus according to the embodiments of the present invention, by using the interpolation method, a third piece of data information is derived according to two pieces of data information in a value search table, which is equivalent to expansion of the capacity of the value search table and thus narrows the circuit area of a digital circuit. In addition, by using the random truncating method, rounding processing is conducted for the interpolation original data, and then the generated random single-bit data is added to an integer portion of the original data. As such, distortion of a sine wave at some frequency points may be prevented. To be specific, with the sine wave generating apparatus according to the embodiments of the present invention, sine waves with richer and more accurate frequencies may be generated by using a digital circuit with a smaller area. By means of MATLAB simulation of the sine wave data information respectively generated in the related art and according to the present invention, as illustrated in FIG. 4 and FIG. 5, it may be obviously observed that the sine wave generated by the sine wave generating apparatus according to the embodiments of the present invention has a better effect in both the time domain and the frequency domain. From the perspective of the time domain, the sine wave generated by the sine wave generating apparatus according to the embodiments of the present invention is smoother and more regular. From the perspective of the frequency domain, the sine wave generated by the sine wave generating apparatus according to the embodiments of the present invention has a smaller harmonic energy.

Another embodiment of the present invention provides a method for generating sine wave, comprising: acquiring configuration information of a sine wave, and generating address information of the sine wave according to the configuration information of the sine wave, wherein the address information of the sine wave comprises integer address information and decimal address information; searching for first data information and second data information of the sine wave according to the integer address information; conducting interpolation between the first data information and the second data information according to the bit width of the decimal address information, and acquiring interpolation original data information of the sine wave according to the decimal address information; conducting truncation processing on the interpolation original data according to the bit width of the decimal address information and a pseudorandom sequence output value to acquire final interpolation data information of the sine wave; and generating image information of the sine wave according to the final interpolation data information of the sine wave.

With respect to the method for generating sine wave according to the embodiments of the present invention, by using the interpolation method, a third piece of data information is derived according to two pieces of data information in a value search table, which is equivalent to expansion of the capacity of the value search table and thus narrows the circuit area of a digital circuit. In addition, by using the random truncating method, rounding processing is conducted for the interpolation original data, and then the generated random single-bit data is added to an integer portion of the original data. As such, distortion of a sine wave at some frequency points may be prevented. To be specific, with the sine wave generating method according to the embodiments of the present invention, sine waves with richer and more accurate frequencies may be generated by using a digital circuit with a smaller area. By means of MATLAB simulation of the sine wave data information respectively generated in the related art and according to the present invention, as illustrated in FIG. 4 and FIG. 5, it may be obviously observed that the sine wave generated by using the sine wave generating method according to the present invention has a better effect in both the time domain and the frequency domain. From the perspective of the time domain, the sine wave generated by using the sine wave generating method according to the embodiments of the present invention is smoother and more regular. From the perspective of the frequency domain, the sine wave generated by using the sine wave generating method according to the embodiments of the present invention has a smaller harmonic energy.

DETAILED DESCRIPTION

The embodiments of the present invention are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary, and are intended to illustrate and interpret the present invention, which shall not be construed as causing limitations to the present invention.

It should be noted that terms such as "first", "second", and the like are merely used for illustration purpose during the description of the present invention, and shall not be understood as indicating or implying relative importance. In the description of the present invention, it should be noted that unless otherwise specified and defined, the terms "coupled" and "connected" and derivative forms of these words shall be understood in a broad sense, which, for example, may be understood as fixed connection, detachable connection or integral connection; may be mechanically connected or electrically connected; or may be directly connected, indirectly connected via an intermediate medium. Persons of ordinary skill in the art may understand the specific meanings of the above terms in the present invention according to the actual circumstances and contexts. In addition, during the description of the present invention, the term "multiple", "more" or "a plurality of" refers to at least two unless otherwise specified.

Any process or method description illustrated in the flowcharts or described herein in any manner may be understood as including one or a plurality of modules, segments or portions of codes of executable instructions for implementing specific logic functions or steps in the processes. In addition, the scope of the preferred embodiments of the present invention covers other implementations. The implementation of the functions or steps may not be subjected to the illustrated or discussed sequence; however, the functions may be implemented in a substantially simultaneous manner or in a contrary sequence according to the involved functions, which shall be understood by a person skilled in the art according to the embodiments of the present invention.

Figure 1:
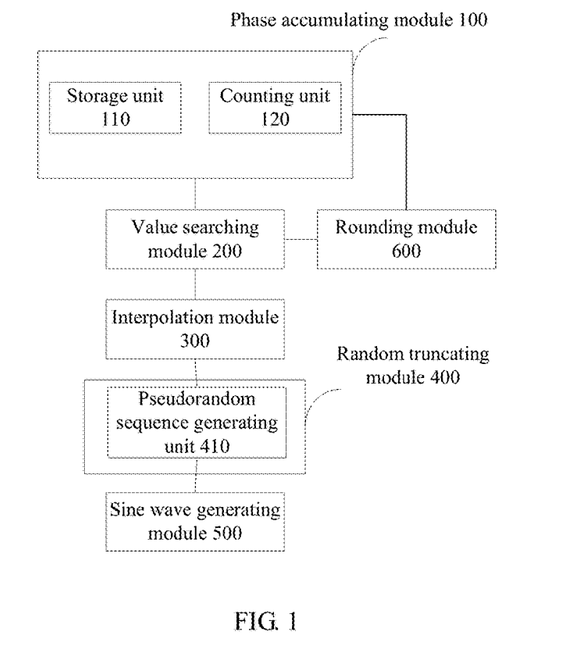
FIG. 1 is a schematic structural diagram of a sine wave generating apparatus according to an embodiment of the present invention.

At present, a plurality of methods are available for generating a sine wave by using a digital circuit. However, most of the methods are somewhat limitative. As such, high power consumption and high cost are caused in the generation of the sine wave by using the digital circuit, and the time-domain and frequency-domain effects of the generated sine wave are poor. If the interpolation method and the random truncating method are used, sine waves with richer and more accurate frequencies may be generated by using a digital circuit with a smaller area. Accordingly, the power consumption of the digital circuit may be reduced, and the application scope of the sine waves may be enlarged by using the sine waves with richer and more accurate frequencies. To this end, the present invention provides a sine wave generating apparatus. FIG. 1 is a schematic structural diagram of a sine wave generating apparatus according to an embodiment of the present invention.

As illustrated in FIG. 1, the sine wave generating apparatus comprises: a phase accumulating module 100, a value searching module 200, an interpolation module 300, a random truncating module 400, a sine wave generating module 500 and a rounding module 600. The phase accumulating module 100 comprises a storage unit 110 and a counting unit 120. The random truncating module 400 comprises a pseudorandom sequence generating unit 410.

To be specific, the phase accumulating module 100 is configured to acquire configuration information of a sine wave, and generate address information of the sine wave according to the configuration information of the sine wave, wherein the address information of the sine wave comprises integer address information and decimal address information.

In the embodiments of the present invention, the phase accumulating module 100 comprises a storage unit 110, wherein the storage unit 110 is configured to store configuration information of a sine wave. To be specific, the phase accumulating module 100 may receive, via a sine wave configuring module, configuration information of a sine wave input by a user, wherein the configuration information of the sine wave comprises an initial phase and frequency of the sine wave. In other words, the sine wave configuring module is an interface module between the phase accumulating module 100 and the user, and the initial phase and frequency received by the sine wave configuring module varies with inputs of the user. Upon acquiring the configuration information of the sine wave, the phase accumulating module 100 may store the initial phase and frequency of the sine wave input by the user into the storage unit 110.

In the embodiments of the present invention, the phase accumulating module 100 further comprises a counting unit 120, wherein the counting unit 120 is configured to conduct accumulative counting for the phase accumulating module 100 according to a clock pulse. To be specific, an initial value of the counting unit 120 may be the initial phase of the sine wave, and the counting step may be the frequency of the sine wave. The bit width of the counting unit 120 may comprise an integer portion and a decimal portion, wherein the bit width of the integer portion is located in the more significant bits of the bit width of the counting unit 120 whereas the bit width of the decimal portion is located in the less significant bits of the bit width of the counting unit 120.

Further, the phase accumulating module 100 may conduct accumulative counting under the effect of an external clock pulse by using the counting unit 120. Each clock pulse counting unit 120 may generate new data information, wherein the new data information is the address information of the sine wave. The external clock pulse may be defined by the user according to the actual needs. In other words, a signal input by the phase accumulating module 100 is the configuration information of the sine wave (the initial phase and frequency of the sine wave), and a signal output by the phase accumulating module 100 is the address information of the sine wave, wherein the address information is formed of an integer address information and a decimal address information when the address information is not integer.

The value searching module 200 is configured to search for first data information and second data information of the sine wave according to the integer address information.

In the embodiments of the present invention, the sine wave generating apparatus further comprises a rounding module 600, wherein the rounding module 600 is configured to round down the address information of the sine wave to acquire the integer address information of the sine wave. To be specific, since the address information of the sine wave acquired by the phase accumulating module 100 comprises the integer address information and the decimal address information, the address information of the sine wave acquired by the phase accumulating module 100 is rounded down by using the rounding module 600, that is, the integer portion of the address information is retained and the decimal portion of the address information is discarded. In other words, a signal input by the rounding module 600 is the address information of the sine wave, and a signal output by the rounding module 600 is the integer portion of the address information. For example, the address information of the sine wave comprises an 8-bit integer portion and a 3-bit decimal portion, and the rounding module 600 rounds down the address information of the sine wave and then outputs the 8-bit integer portion.

To be specific, the value searching module 200 may search for the corresponding data information in a value search table according to the integer address information of the address information of the sine wave acquired by the phase accumulating module 100. In other words, a signal input by the value searching module 200 is the integer address information, and a signal output by the value searching module 200 is first data information and second data information of the sine wave. A cycle of data information of the sine wave acquired via sampling may be stored in the value search table, wherein the data information may be solidified in a circuit or may be dynamically configured by the user. In addition, in the value search table, each the address information of sine wave corresponds to a piece of data information, and the value searching module 200 may only receive the integer address information in the address information of the sine wave. Therefore, when the address information of the sine wave output by the phase accumulating module 100 comprises a decimal portion, firstly the rounding module 600 rounds down the address information of the sine wave, and then outputs the obtained integer address information to the value searching module 200. Afterwards, the value searching module 200 conducts value searching in the value search table according to the input integer address information, and outputs the first data information corresponding to the integer address information and outputs next piece of data information adjacent to the first data information in the value search table, that is, the second data information. Further, the data information output by the value searching module 200 according to the integer address information should be the first data information, and the second data information is data information additionally output for interpolation.

In the embodiments of the present invention, the value searching module 200 stores a first value search table and a second value search table, wherein the value searching module 200 further comprises a random access memory or a read-only memory, and the first value search table and the second value search table are stored in the random access memory or the read-only memory. The first value search table stores one piece of the data information of the sine wave corresponding to odd address information/even address information in the integer address information, and the second value search table stores the other piece of the data information of the sine wave corresponding to the odd address information/the even address information in the integer address information. To be specific, the depth of the value search table is associated with the bit width of the integer address information in the address information of the sine wave output by the phase accumulating module 100. For example, if the bit width of the integer address information is 8 bits, the depth of the value search table is $2^8=256$. It should be understood that the bit width of the value search table is subject to no fixed limitation. A greater bit width of the value search table indicates a higher precision of the value search table. Generally, the bit width of the value search table is the same as the bit width of a cycle of data information of the sine wave acquired via sampling in the value search table.

In addition, relatively, a greater bit width of the value search table indicates a larger area of the value search table. Therefore, the value search module 200 may partition a value search table into two sub value search tables having the same depth and bit width, that is, a first value search table and a second value search table. For example, if the depth of the value search table is 256, both the first value search table and the second value search table have a depth of 256/2=128. A cycle of data information of the sine wave is crosswise stored in the first value search table and the second value search table. For example, data information of the sine wave corresponding to the odd integer address information is stored in the first value search table, and data information of the sine wave corresponding to the even integer address information is stored in the second value search table. Alternatively, data information of the sine wave corresponding to the even integer address information is stored in the first value search table, and data information of the sine wave corresponding to the odd integer address information is stored in the second value search table.

In the embodiments of the present invention, the value searching module 200 is further configured to conduct value searching in the first value search table/the second value search table according to the integer address information to acquire the first data information corresponding to the integer address information, and conduct value searching in the second value search table according to next integer address information adjacent to the integer address information to acquire the second data information corresponding to the next integer address information. As such, upon receiving the integer address information output by the rounding module 600, the value searching module 200 may simultaneously output two pieces of data information, wherein these two pieces of data information are adjacent in sampling data of the sine wave.

The interpolation module 300 is configured to conduct interpolation between the first data information and the second data information according to the bit width of the decimal address information, and acquire interpolation original data information of the sine wave according to the decimal address information. To be specific, the interpolation module 300 may calculate out a plurality of pieces of interpolation data information between the first data information and the second data information according to the first data information, the second data information and the decimal address information, and then the interpolation module 300 selects desired information from the first data information, the second data information and the plurality of pieces of interpolation data information according to the decimal address information, as interpolation original data information of the sine wave. For example, assume that the first data information is $V_m$, the second data information is $V_p$, the decimal address information in the address information of the sine wave is $f_a$, a difference between the first data information and the second data information is $V_d$, wherein $V_d = V_p - V_m$. Assume that the bit with of the decimal address information $f_a$ is 3 bits, then the interpolation module 300 may calculate out that there may be $2^3 = 8$ possible pieces of interpolation original data information, that is, seven interpolation points may be inserted between the first data information $V_m$ and the second data information $V_p$. These seven interpolation points are evenly distributed between the first data information $V_m$ and the second data information $V_p$, and values at the seven interpolation points are respectively $V_m + V_d/8$, $V_m + 2V_d/8$, $V_m + 3V_d/8$, $V_m + 4V_d/8$, $V_m + 5V_d/8$, $V_m + 6V_d/8$ and $V_m + 7V_d/8$. Then, a value is selected form the first data information $V_m$ and the inserted seven interpolation points according to the value of the decimal address information $f_a$. A specific corresponding relationship is as illustrated in Table 1.

| $f_a$ | Interpolation original data |
|---|---|
| 000 | $V_m \ll 3$ |
| 001 | $V_m \ll 3 + V_d$ |
| 010 | $V_m \ll 3 + V_d \ll 1$ |
| 011 | $V_m \ll 3 + V_d \ll 1 + V_d$ |
| 100 | $V_m \ll 3 + V_d \ll 2$ |
| 101 | $V_m \ll 3 + V_d \ll 2 + V_d$ |
| 110 | $V_m \ll 3 + V_d \ll 2 + V_d \ll 1$ |
| 111 | $V_m \ll 3 + V_d \ll 2 + V_d \ll 1 + V_d$ |

Table 1 lists a corresponding relationship between the decimal address information $f_a$ and the interpolation original data.

The symbol "$\ll$" represents a leftward shift operation. For example, if the decimal address information $f_a$ is "001", it is equivalent to selecting, by the value searching module 200, a first interpolation point between the first data information $V_m$ and the second data information $V_p$. The value of the first interpolation point is $V_m + V_d/8$, that is, $(8V_m + V_d)/8$, specifically, $(V_m \ll 3 + V_d)/8$, wherein $(V_m \ll 3 + V_d)$ is the interpolation original data information.

It should be understood that the bit width of the integer portion in the bit width of the counting unit 120 is determined by the depth of the value search table. A greater depth of the value search table indicates a larger bit width of the integer portion. The bit width of the decimal portion in the bit width of the counting unit 120 is determined by the precision of the interpolation. The higher precision for interpolation is, the larger the bit width of the decimal portion is. For example, if the depth of the value search table is 256, the bit width of the integer portion in the bit width of the counting unit 120 is 8 bits. When the interpolation module 300 conducts interpolation, if seven points need to be inserted between each two points (that is, the first data information and the second data information), the bit width of the decimal portion in the bit width of the counting unit 120 is 3 bits. Therefore, the bit width of the counting unit 120 is 8+3=11, wherein the more significant 8 bits constitute the integer portion, and less significant 3 bits constitute the decimal portion.

Figure 2:
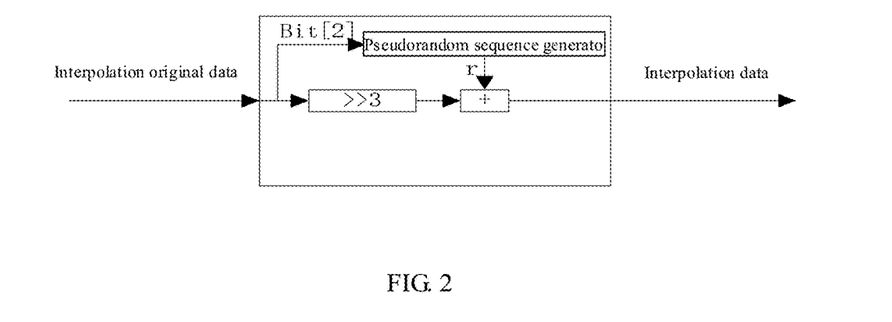
FIG. 2 is a schematic structural diagram of a random truncating module 400 according to an embodiment of the present invention.

The random truncating module 400 is configured to conduct truncation processing on the interpolation original data according to the bit width of the decimal address information and a pseudorandom sequence output value to acquire final interpolation data information of the sine wave. To be specific, the random truncating module 400 may perform an operation of dividing the interpolation original data by 8. Furthermore, in a digital circuit, the interpolation original data is directly shifted to the right by 3 bits to implement the operation of division by 8. However, since not all the interpolation original data can be divided by 8, in the embodiments of the present invention, the random truncating module 400 further performs rounding processing for the data by using a random truncating method after the interpolation original data is divided by 8. FIG. 2 is a schematic structural diagram of a random truncating module 400 according to an embodiment of the present invention. As illustrated in FIG. 2, in the internal structure of the random truncating module 400, Bit[2] represents the third bit of the interpolation original data, that is, the most significant bit that is discarded, r represents a pseudorandom sequence output value, wherein the bit width of the pseudorandom sequence output value is 1 bit. Assume that the interpolation original data is v, the final interpolation data information is vv3+r, wherein "$\gg$" represents a shift operation to the right, and "$v \gg 3$" represents that the interpolation original data v is shifted to the right by 3 bits, which is equivalent to that the interpolation original data is divided by 8.

Figure 3:
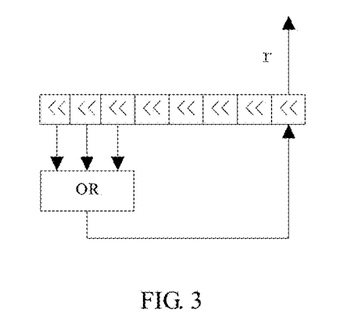
FIG. 3 is a schematic structural diagram of a pseudorandom sequence generator according to an embodiment of the present invention.

In the embodiments of the present invention, the random truncating module 400 comprises a pseudorandom sequence generating unit 410. The pseudorandom sequence generating unit 410 is configured to output the pseudorandom sequence output value according to a predetermined bit width. Furthermore, the pseudorandom sequence generating unit 410 may be, for example, a pseudorandom sequence generator, the pseudorandom sequence output value r may be output by the pseudorandom sequence generator, and the pseudorandom sequence generator may output the pseudorandom sequence output value r through an internal operation according to Bit[2]. FIG. 3 is a schematic structural diagram of a pseudorandom sequence generating unit 410 according to an embodiment of the present invention. As illustrated in FIG. 3, in the internal circuit structure of the pseudorandom sequence generating unit 410, the bit width of the pseudorandom sequence generator is 8 bits, and an initialized value of the pseudorandom sequence generator is associated with Bit[2]. The specific settings may vary with different application scenarios. The symbol "<<" represents a leftward shift operation. After the random sequence generator generates a pseudorandom sequence output value r, the entire pseudorandom sequence generator is shifted to the left by 1 bit, and the least significant bit is filled by an "OR" operation result of the more significant 3 bits.

The sine wave generating module 500 is configured to generate image information of the sine wave according to the final interpolation data information of the sine wave.

With the sine wave generating apparatus according to the embodiments of the present invention, by using the interpolation method, a third piece of data information is derived according to two pieces of data information in a value search table, which is equivalent to expansion of the capacity of the value search table and thus narrows the circuit area of a digital circuit. In addition, by using the random truncating method, rounding processing is conducted for the interpolation original data, and then the generated random single-bit data is added to an integer portion of the original data. As such, distortion of a sine wave at some frequency points may be prevented. To be specific, with the sine wave generating apparatus according to the embodiments of the present invention, sine waves with richer and more accurate frequencies may be generated by using a digital circuit with a smaller area. By means of MATLAB simulation of the sine wave data information respectively generated in the related art and according to the present invention, as illustrated in FIG. 4 and FIG. 5, it may be obviously observed that the sine wave generated by the sine wave generating apparatus according to the present invention has a better effect in both the time domain and the frequency domain. From the perspective of the time domain, the sine wave generated by the sine wave generating apparatus according to the embodiments of the present invention is smoother and more regular. From the perspective of the frequency domain, the sine wave generated by the sine wave generating apparatus according to the embodiments of the present invention has a smaller harmonic energy.

To practice the above embodiments, the present invention further provides a sine wave generating method.

Figure 6:
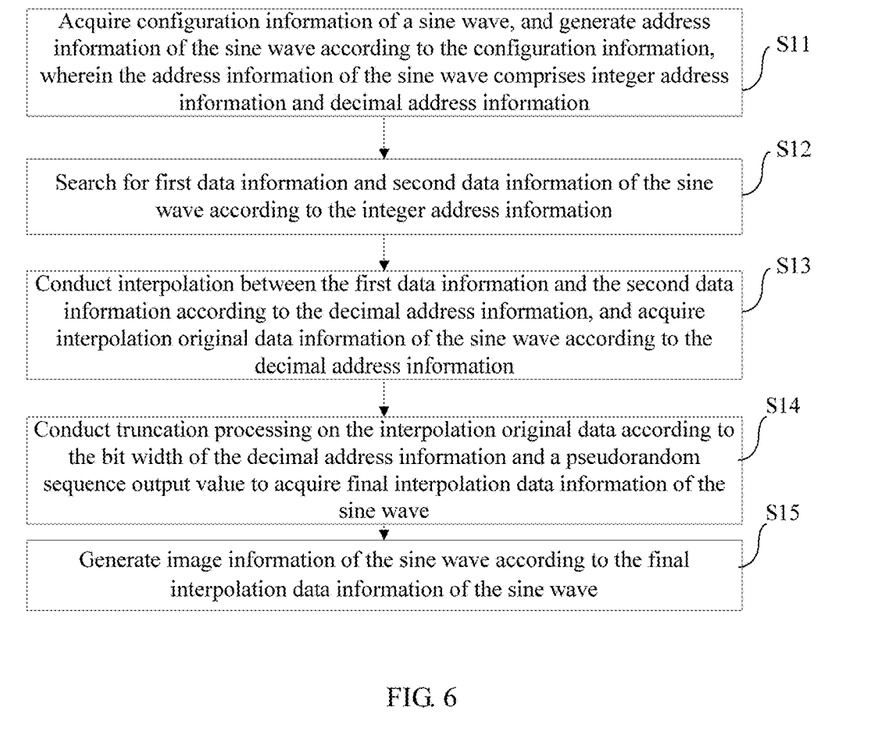
FIG. 6 is a flowchart of a sine wave generating method according to an embodiment of the present invention.
Figure 7:
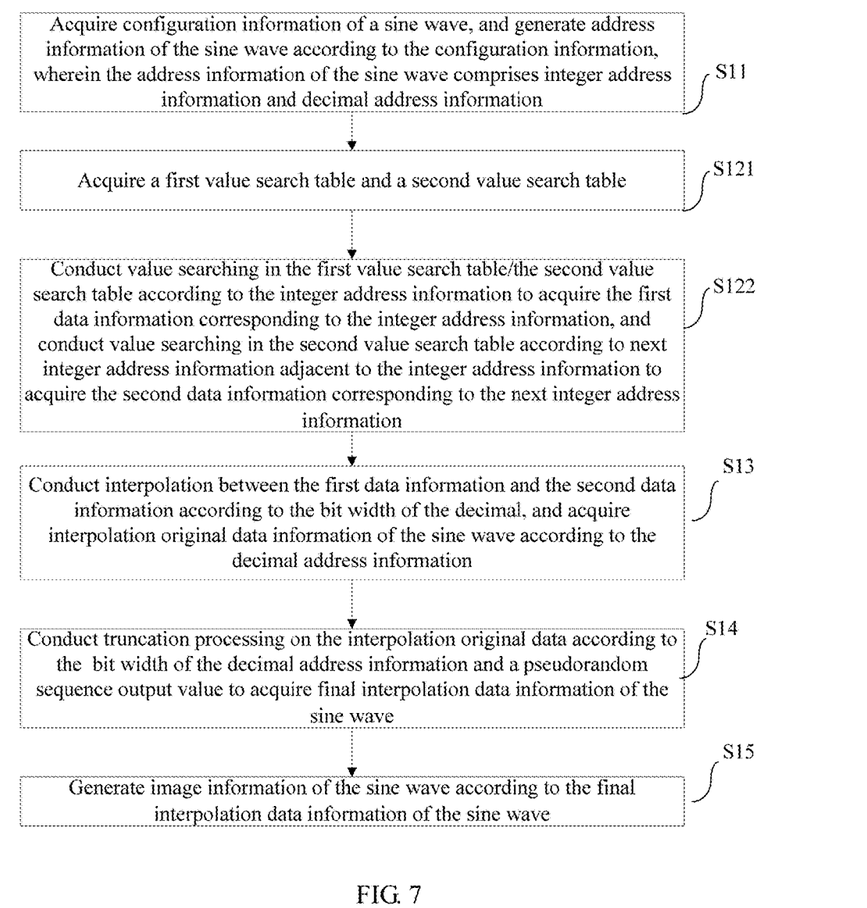
FIG. 7 is a flowchart of a sine wave generating method according to one specific embodiment of the present invention.

FIG. 6 is a flowchart of a sine wave generating method according to an embodiment of the present invention. FIG. 7 is a flowchart of a sine wave generating method according to one specific embodiment of the present invention.

As illustrated in FIG. 6 and FIG. 7, the sine wave generating method comprises:

S11: Acquiring configuration information of a sine wave, and generating address information of the sine wave according to the configuration information of the sine wave, wherein the address information of the sine wave comprises integer address information and decimal address information.

S12: Searching for first data information and second data information of the sine wave according to the integer address information.

Specifically, the corresponding data information of the sine wave is searched from a value search table via the acquired integer address information in the address information of the sine wave. A cycle of data information of the sine wave acquired via sampling may be stored in the value search table, wherein the data information may be solidified in a circuit or may be dynamically configured by the user. In addition, when the address information of the sine wave comprises a decimal portion, the integer address information needs firstly to be acquired, the value searching is conducted in the value search table according to the integer address information, the first data information is output corresponding to the integer address information, and meanwhile the next data information adjacent to the first data information in the value search table is output, that is, the second data information. Further, the data information output according to the integer address information should be the first data information, and the second data information is data information additionally output for interpolation.

In the embodiments of the present invention, S12 specifically comprises:

S121: Acquiring a first value search table and a second value search table.

Specifically, the first value search table and the second value search table are stored in a random access memory or a read-only memory. The first value search table stores one piece of the data information of the sine wave corresponding to odd address information/even address information in the integer address information, and the second value search table stores the other piece of the data information of the sine wave corresponding to the odd address information/the even address information in the integer address information. More specifically, the depth of the value search table is associated with the integer address information in the address information of the sine wave. For example, if the bit width of the integer address information is 8 bits, the depth of the value search table is $2^8=256$. It should be understood that the bit width of the value search table is subject to no fixed limitation. A greater bit width of the value search table indicates a higher precision of the value search table. Generally, the bit width of the value search table is the same as the bit width of a cycle of data information of the sine wave acquired via sampling in the value search table.

In addition, relatively, a greater bit width of the value search table indicates a larger area of the value search table. Therefore, a value search table may be partitioned into two sub value search tables having the same depth and bit width, that is, a first value search table and a second value search table. For example, if the depth of the value search table is 256, both the first value search table and the second value search table have a depth of 256/2=128. A cycle of data information of the sine wave is crosswise stored in the first value search table and the second value search table. For example, data information of the sine wave corresponding to the odd integer address information is stored in the first value search table, and data information of the sine wave corresponding to the even integer address information is stored in the second value search table. Alternatively, data information of the sine wave corresponding to the even integer address information is stored in the first value search table, and data information of the sine wave corresponding to the odd integer address information is stored in the second value search table.

S122: Conducting value searching in the first value search table/the second value search table according to the integer address information to acquire the first data information corresponding to the integer address information, and conducting value searching in the second value search table according to next integer address information adjacent to the integer address information to acquire the second data information corresponding to the next integer address information.

S13: Conducting interpolation between the first data information and the second data information according to the bit width of the decimal address information, and acquiring interpolation original data information of the sine wave according to the decimal address information.

To be specific, a plurality of pieces of interpolation data information between the first data information and the second data information may be calculated out according to the first data information, the second data information and the decimal address information, and then the interpolation module 300 selects desired information from the first data information, the second data information and the plurality of pieces of interpolation data information according to the decimal address information, as interpolation original data information of the sine wave. For example, assume that the first data information is $V_m$, the second data information is $V_p$, the decimal address information in the address information of the sine wave is $f_a$, a difference between the first data information and the second data information is $V_d$, wherein $V_d = V_p - V_m$. Assume that the bit with of the decimal address information $f_a$ is 3 bits, then the interpolation module 300 may calculate out that there may be $2^3=8$ possible pieces of interpolation original data, that is, seven interpolation points may be inserted between the first data information $V_m$ and the second data information $V_p$. These seven interpolation points are evenly distributed between the first data information $V_m$ and the second data information $V_p$, and values at the seven interpolation points are respectively $V_m + V_d/8$, $V_m + 2V_d/8$, $V_m + 3V_d/8$, $V_m + 4V_d/8$, $V_m + 5V_d/8$, $V_m + 6V_d/8$ and $V_m + 7V_d/8$. Then, a value is selected form the first data information $V_m$ and the inserted seven interpolation points according to the value of the decimal address information $f_a$. A specific corresponding relationship is as illustrated in Table 1.

| $f_a$ | Interpolation original data |
|---|---|
| 000 | $V_m \ll 3$ |
| 001 | $V_m \ll 3 + V_d$ |
| 010 | $V_m \ll 3 + V_d \ll 1$ |
| 011 | $V_m \ll 3 + V_d \ll 1 + V_d$ |
| 100 | $V_m \ll 3 + V_d \ll 2$ |
| 101 | $V_m \ll 3 + V_d \ll 2 + V_d$ |
| 110 | $V_m \ll 3 + V_d \ll 2 + V_d \ll 1$ |
| 111 | $V_m \ll 3 + V_d \ll 2 + V_d \ll 1 + V_d$ |

Table 1 lists a corresponding relationship between the decimal address information $f_a$ and the interpolation original data.

The symbol "$\ll$" represents a leftward shift operation. For example, if the decimal address information $f_a$ is "001", it is equivalent to selecting a first interpolation point between the first data information $V_m$ and the second data information $V_p$. The value of the first interpolation point is $V_m + V_d/8$, that is, $(8V_m + V_d)/8$, specifically, $(V_m \ll 3 + V_d)/8$, wherein $(V_m \ll 3 + V_d)$ is the interpolation original data information.

S14: Conducting truncation processing on the interpolation original data according to the bit width of the decimal address information and a pseudorandom sequence output value to acquire final interpolation data information of the sine wave.

To be specific, an operation of dividing the interpolation original data by 8 is performed. Furthermore, in a digital circuit, the interpolation original data is directly shifted to the right by 3 bits to implement the operation of division by 8. However, since not all the interpolation original data can be divided by 8, in the embodiments of the present invention, rounding processing is further conducted for the data by using a random truncating method after the interpolation original data is divided by 8.

S15: Generating image information of the sine wave according to the final interpolation data information of the sine wave.

With the sine wave generating method according to the embodiments of the present invention, by using the interpolation method, a third piece of data information is derived according to two pieces of data information in a value search table, which is equivalent to expansion of the capacity of the value search table and thus narrows the circuit area of a digital circuit. In addition, by using the random truncating method, rounding processing is conducted for the interpolation original data, and then generated random single-bit data is added to an integer portion of the original data. As such, distortion of a sine wave at some frequency points may be prevented. To be specific, with the sine wave generating method according to the embodiments of the present invention, sine waves with richer and more accurate frequencies may be generated by using a digital circuit with a smaller area. By means of MATLAB simulation of the sine wave data information respectively generated in the related art and according to the present invention, as illustrated in FIG. 4 and FIG. 5, it may be obviously observed that the sine wave generated by using the sine wave generating method according to the present invention has a better effect in both the time domain and the frequency domain. From the perspective of the time domain, the sine wave generated by using the sine wave generating method according to the embodiments of the present invention is smoother and more regular. From the perspective of the frequency domain, the sine wave generated by using the sine wave generating method according to the embodiments of the present invention has a smaller harmonic energy.

Figure 8:
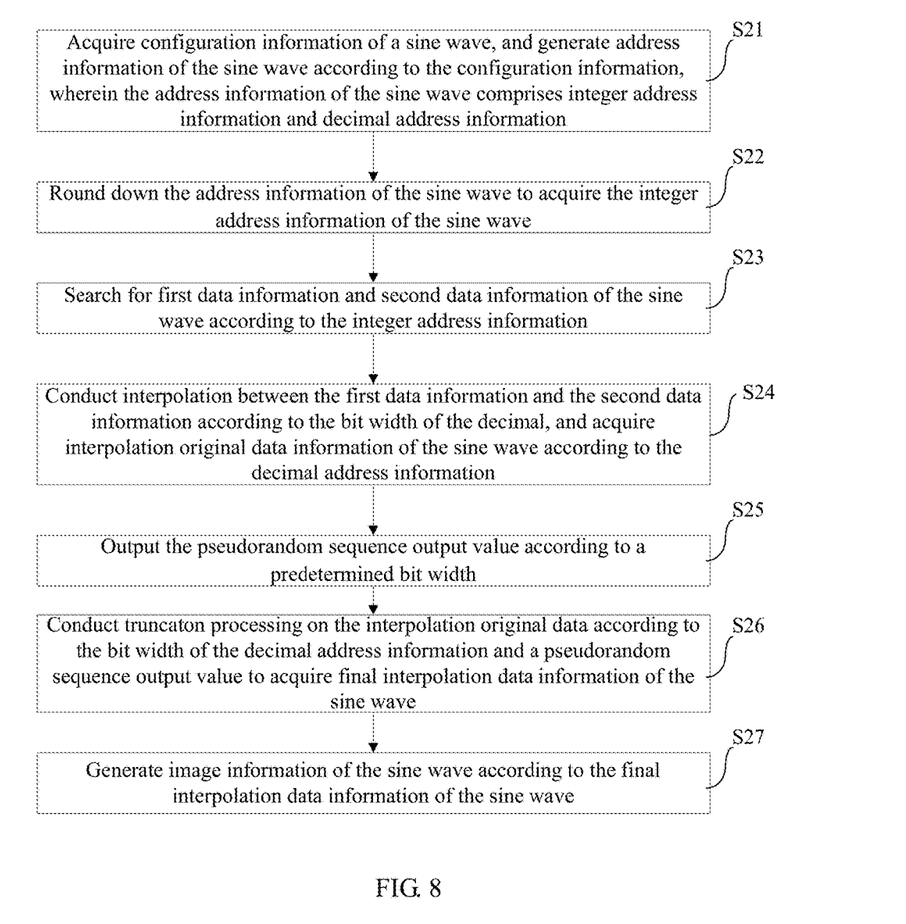
FIG. 8 is a flowchart of a sine wave generating method according to another specific embodiment of the present invention.

FIG. 8 is a flowchart of a sine wave generating method according to another specific embodiment of the present invention.

As illustrated in FIG. 8, the sine wave generating method comprises:

S21: Acquiring configuration information of a sine wave, and generating address information of the sine wave according to the configuration information of the sine wave, wherein the address information of the sine wave comprises integer address information and decimal address information.

S22: Rounding down the address information of the sine wave to acquire the integer address information of the sine wave.

To be specific, since the address information of the sine wave comprises the integer address information and the decimal address information, the address information of the sine wave acquired is rounded down, that is, the integer portion of the address information is retained and the decimal portion of the address information is discarded. For example, the address information of the sine wave comprises an 8-bit integer portion and a 3-bit decimal portion, and the address information of the sine wave is rounded down and then the 8-bit integer portion is output.

S23: Searching for first data information and second data information of the sine wave according to the integer address information.

S24: Conducting interpolation between the first data information and the second data information according to the bit width of the decimal address information, and acquiring interpolation original data information of the sine wave according to the decimal address information.

S25: Outputting the pseudorandom sequence output value according to a predetermined bit width.

Specifically, the pseudorandom sequence output value may be output by the pseudorandom sequence generator, and the pseudorandom sequence generator may output the pseudorandom sequence output value through an internal operation according to Bit[2]. As illustrated in FIG. 3, a bit width of the pseudorandom sequence generator is 8 bits, and an initialized value is associated with Bit [2]. The specific settings may vary with different application scenarios. The symbol "<<" represents a leftward shift operation. After the random sequence generator generates a pseudorandom sequence output value r, the entire pseudorandom sequence generator is shifted to the left by 1 bit, and the least significant bit is filled by an "OR" operation result of the more significant 3 bits.

S26: Conducting truncation processing on the interpolation original data according to the bit width of the decimal address information and a pseudorandom sequence output value to acquire final interpolation data information of the sine wave.

S27: Generating image information of the sine wave according to the final interpolation data information of the sine wave.

With the sine wave generating method according to the embodiments of the present invention, since the first data information and the second data information of the sine wave are searched only according to the integer address information in the address information of the sine wave, the integer address information of the sine wave is acquired by rounding down the address information of the sine wave.

Figure 9:
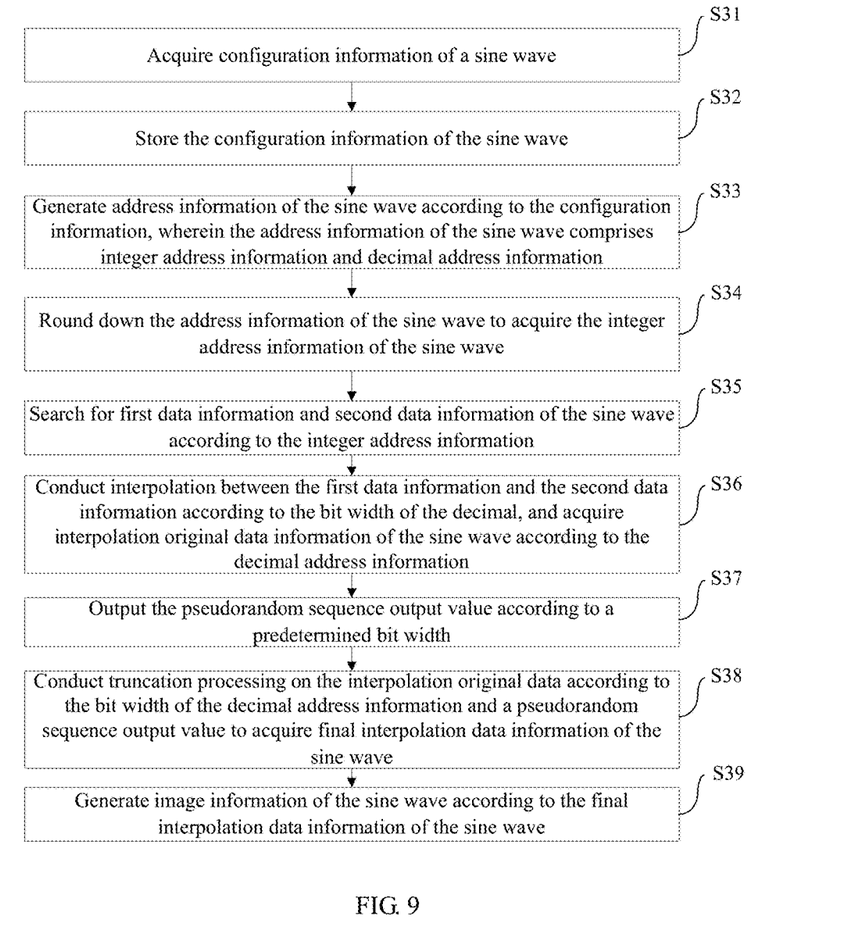
FIG. 9 is a flowchart of a sine wave generating method according to still another specific embodiment of the present invention.

FIG. 9 is a flowchart of a sine wave generating method according to still another specific embodiment of the present invention.

As illustrated in FIG. 9, the sine wave generating method comprises:

S31: Acquiring configuration information of a sine wave.

S32: Storing the configuration information of the sine wave.

Specifically, configuration information of a sine wave input by a user may be received, wherein the configuration information of the sine wave comprises an initial phase and frequency of the sine wave. The received initial phase and frequency varies with inputs of the user. After the configuration information of the sine wave is acquired, the initial phase and frequency of the sine wave input by the user are stored.

S33: Generating address information of the sine wave according to the configuration information of the sine wave, wherein the address information of the sine wave comprises integer address information and decimal address information.

In the embodiments of the present invention, accumulative counting is conducted according to a clock pulse. Furthermore, the accumulative counting is conducted under the effect of an external clock pulse. Each clock pulse generates new data information, wherein the new data information is the address information of the sine wave. The external clock pulse may be defined by the user according to the actual needs. S34: Rounding down the address information of the sine wave to acquire the integer address information of the sine wave.

S35: Searching for first data information and second data information of the sine wave according to the integer address information.

S36: Conducting interpolation between the first data information and the second data information according to the bit width of the decimal address information, and acquiring interpolation original data information of the sine wave according to the decimal address information.

S37: Outputting the pseudorandom sequence output value according to a predetermined bit width.

S38: Conducting truncation processing on the interpolation original data according to the bit width of the decimal address information and a pseudorandom sequence output value to acquire final interpolation data information of the sine wave.

S39: Generating image information of the sine wave according to the final interpolation data information of the sine wave.

With the sine wave generating method according to the embodiments of the present invention, the initial phase and frequency of the sine wave may be stored, and the clock pulse may be generated according to the initial phase and frequency of the sine wave.

It should be understood that each part of the present invention may be implemented by using hardware, software, firmware or a combination of them. In the above embodiments, the multiple steps or methods may be implemented by using software or firmware which is stored in a memory and executed by a suitable instruction execution system. For example, if the multiple steps or methods are implemented by using hardware, similar to another embodiment, the steps or methods may be implemented by using any one or a combination of the following technologies that are commonly known in the art: a discrete logic circuit of a logic gate circuit configured to implement logic function to data signals, an application specific integrated circuit having a suitable combinational logic gate, a programmable gate array (PGA), a field-programmable gate array (FPGA), and the like.

In the description of the present specification, reference terms such as "an embodiment", "some embodiments", "examples", "specific examples", "some examples", or the like are intended to refer to that the specific features, structures, materials, or characteristics which are described in combination with the embodiments or examples are comprised in at least one embodiment or example of the present invention. In this specification, schematic expressions of the above terms do not necessarily indicate the same embodiments or examples. In addition, the described specific features, structures, materials, or characteristics may be combined in any one or multiple embodiments or examples in a suitable way. In addition, in case of no contradiction, a person skilled in the art may incorporate or combine different embodiments or examples and features of different embodiments or examples described in this specification.

Although the above description illustrates the embodiments of the present invention, it can be understood that the embodiments are merely exemplary, and shall not be construed as limitations to the present invention. Persons of ordinary skill in the art may derive variations, modifications, and replacements to the above embodiments within the scope of the present invention.

INDUSTRIAL APPLICABILITY

With the sine wave generating apparatus and method according to the embodiments of the present invention, by using the interpolation method, a third piece of data information is derived according to two pieces of data information in a value search table, which is equivalent to expansion of the capacity of the value search table and thus narrows the circuit area of a digital circuit. In addition, by using the random truncating method, rounding processing is conducted for the interpolation original data, and then generated random single-bit data is added to an integer portion of the original data. As such, distortion of a sine wave at some frequency points may be prevented. To be specific, with the sine wave generating apparatus according to the embodiments of the present invention, sine waves with richer and more accurate frequencies may be generated by using a digital circuit with a smaller area. By means of MATLAB simulation of the sine wave data information respectively generated in the related art and according to the present invention, the generated sine wave generated has a better effect in both the time domain and the frequency domain. From the perspective of the time domain, the sine wave generated by the sine wave generating apparatus according to the embodiments of the present invention is smoother and more regular. From the perspective of the frequency domain, the sine wave generated by the sine wave generating apparatus according to the embodiments of the present invention has a smaller harmonic energy.

What is claimed is:

1. A sine wave generating apparatus, comprising:
    a phase accumulating module, configured to acquire configuration information of a sine wave, and generate address information of the sine wave according to the configuration information of the sine wave, wherein the address information of the sine wave comprises integer address information and decimal address information;
    a value searching module, configured to search for first data information and second data information of the sine wave according to the integer address information;
    an interpolation module, configured to conduct interpolation between the first data information and the second data information according to a bit width of the decimal address information, and acquire interpolation original data information of the sine wave according to the decimal address information;
    a random truncating module, configured to conduct truncation processing on the interpolation original data according to the bit width of the decimal address information and a pseudorandom sequence output value to acquire final interpolation data information of the sine wave; and
    a sine wave generating module, configured to generate image information of the sine wave according to the final interpolation data information of the sine wave.

2. The sine wave generating apparatus according to claim 1, wherein the value searching module stores a first value search table and a second value search table, wherein the first value search table stores one piece of the data information of the sine wave corresponding to odd address information/even address information in the integer address information, and the second value search table stores the other piece of the data information of the sine wave corresponding to the even address information/the odd address information in the integer address information.

3. The sine wave generating apparatus according to claim 2, wherein the value searching module comprises a random access memory or a read-only memory, and the first value search table and the second value search table are stored in the random access memory or the read-only memory.

4. The sine wave generating apparatus according to claim 3, wherein the value searching module is further configured to conduct value searching in the first value search table/the second value search table according to the integer address information to acquire the first data information corresponding to the integer address information, and conduct value searching in the second value search table according to next integer address information adjacent to the integer address information to acquire the second data information corresponding to the next integer address information.

5. The sine wave generating apparatus according to claim 1, further comprising:
    a rounding module, configured to round down the address information of the sine wave to acquire the integer address information of the sine wave.

6. The sine wave generating apparatus according to claim 1, wherein the phase accumulating module comprises:
    a storage unit, configured to store the configuration information of the sine wave, wherein the configuration information of the sine wave comprises an initial phase and frequency of the sine wave.

7. The sine wave generating apparatus according to claim 6, wherein the phase accumulating module further comprises:
    a counting unit, configured to conduct accumulative counting for the phase accumulating module according to a clock pulse.

8. The sine wave generating apparatus according to claim 1, wherein the random truncating module comprises:
    a pseudorandom sequence generating unit, configured to output the pseudorandom sequence output value according to a predetermined bit width.

9. A method for generating sine wave, comprising:
    acquiring configuration information of a sine wave, and generating address information of the sine wave according to the configuration information of the sine wave, wherein the address information of the sine wave comprises integer address information and decimal address information;
    searching for first data information and second data information of the sine wave according to the integer address information;
    conducting interpolation between the first data information and the second data information according to a bit width of the decimal address information, and acquiring interpolation original data information of the sine wave according to the decimal address information;
    conducting truncation processing on the interpolation original data according to the bit width of the decimal address information and a pseudorandom sequence output value to acquire final interpolation data information of the sine wave; and
    generating image information of the sine wave according to the final interpolation data information of the sine wave.

10. The method according to claim 9, wherein the searching for first data information and second data information of the sine wave according to the integer address information comprises:
    acquiring a first value search table and a second value search table; and
    conducting value searching in the first value search table/the second value search table according to the integer address information to acquire the first data information corresponding to the integer address information, and conducting value searching in the second value search table according to next integer address information adjacent to the integer address information to acquire the second data information corresponding to the next integer address information.

11. The method according to claim 10, wherein the first value search table stores one piece of the data information of the sine wave corresponding to odd address information/ even address information in the integer address information, and the second value search table stores the other piece of the data information of the sine wave corresponding to the even address information/the odd address information in the integer address information.

12. The method according to claim 11, wherein the first value search table and the second value search table are stored in a random access memory or a read-only memory.

13. The method according to claim 9, wherein upon the generating address information of the sine wave according to the configuration information of the sine wave, the method further comprises:
   rounding down the address information of the sine wave to acquire the integer address information of the sine wave.

14. The method according to claim 9, wherein upon the acquiring configuration information of a sine wave, the method further comprises:
   storing the configuration information of the sine wave, wherein the configuration information of the sine wave comprises an initial phase and frequency of the sine wave.

15. The method according to claim 14, wherein prior to the generating address information of the sine wave according to the configuration information of the sine wave, the method further comprises:
   conducting accumulative counting according to a clock pulse.

16. The method according to claim 9, wherein prior to the conducting truncation processing on the interpolation original data according to a bit width of the decimal address information and a pseudorandom sequence output value, the method further comprises:
   outputting the pseudorandom sequence output value according to a predetermined bit width.

* * * * *